(12) United States Patent
Sun et al.

(10) Patent No.: US 6,231,918 B1
(45) Date of Patent: May 15, 2001

(54) OXIDE FILM THICKNESS STANDARDS AND MANUFACTURING METHODS THEREOF

(75) Inventors: Jung-woo Sun, Seoul; Sang-kil Lee, Kyungki-do, both of (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/409,564

(22) Filed: Sep. 30, 1999

Related U.S. Application Data

(62) Division of application No. 09/064,800, filed on Apr. 22, 1998, now Pat. No. 6,008,503.

(30) Foreign Application Priority Data

Jun. 25, 1997 (KR) .................................................. 97-27093

(51) Int. Cl.$^7$ .................................................. C23C 16/503
(52) U.S. Cl. ........................ 427/99; 427/579; 427/255.7; 438/14; 73/1.01; 73/1.81
(58) Field of Search .................. 427/99, 579, 255.7; 438/14; 73/1.01, 1.81

(56) References Cited

U.S. PATENT DOCUMENTS

| | | | |
|---|---|---|---|
| 4,355,903 | 10/1982 | Sandercock | 356/382 |
| 5,356,722 | 10/1994 | Nguyen et al. | 427/269 |
| 5,486,701 | 1/1996 | North et al. | 250/372 |
| 5,535,359 | * 7/1996 | Bartha et al. | . |
| 5,578,745 | * 11/1996 | Bayer et al. | . |
| 5,686,993 | 11/1997 | Kokubo et al. | 356/381 |
| 5,851,602 | * 12/1998 | Law et al. | . |

OTHER PUBLICATIONS

Candela et al., SPIE vol. 661, Optical Testing and Metrology, pp 402–407, 1986 (no month).*

VLSI Standards Incorporated, 1996 Product Guide (No month).

* cited by examiner

*Primary Examiner*—Timothy Meeks
(74) *Attorney, Agent, or Firm*—Myers Bigel Sibley & Sajovec

(57) ABSTRACT

A film thickness standard (FTS) comprises an oxide film formed on a semiconductor substrate with a thickness over 1 $\mu$m. A method of preparing an oxide film thickness standard reference of semiconductor device is carried out by repeatedly and continuously performing the formation process of the oxide film under the same processing conditions thereby to form the oxide film on a semiconductor substrate with a thickness over a certain level.

9 Claims, 2 Drawing Sheets

OXIDE FILM THICKNESS STANDARDS AND MANUFACTURING METHODS THEREOF

This application is a divisional of U.S. application Ser. No. 09/064,800, filed Apr. 22, 1998, now U.S. Pat. No. 6,008,503.

FIELD OF THE INVENTION

This invention relates to microelectronic devices and manufacturing methods, and more particularly to film thickness standards and manufacturing methods thereof

BACKGROUND OF THE INVENTION

Generally, integrated circuit devices are manufactured in such a manner that various kinds of films are formed on the semiconductor substrates. The various kinds of films are formed to have certain ranges of thickness. Accordingly, a film thickness standard (FTS) reference material measuring film thickness is provided and used to control the thickness of the various kinds of films.

The conventional oxide film thickness standard reference has a thickness less than 1 μm. The oxide film thickness standard reference having a thickness of less than 1 μm is described in detail in the catalogue of VLSI Standards Incorporated 1996 Product Guide.

However, the above oxide film standard thickness reference having a thickness below 1 μm may not be sufficient to calibrate state of the art thin film manufacturing including an oxide film over 1 μm thick.

Unfortunately, it may be difficult to fabricate oxide film thickness standards having a thickness over 1 μm without defects such as uniformity variations. Thus, it generally is difficult to set up process conditions to prepare the oxide film thickness standard reference having a thickness over 1 μm.

SUMMARY OF THE INVENTION

The present invention provides a film thickness standard (FTS) that can be used to calibrate the thickness of an oxide film having a thickness over 1 μm. The film thickness standard comprises an oxide film having a thickness over 1 μm on a semiconductor substrate.

The semiconductor substrate is preferably a silicon substrate. Preferably, the oxide film is a plasma enhanced oxide film or Tetra-Ethyl-Orthosilicate oxide film.

The thickness value designated as the thickness of said oxide film has continuity in thickness, and preferably, the continuous thickness is a linear function on plane coordinates. The oxide film is formed having a thickness of 1.1 μm to 1.3 μm, 2.3 μm to 2.5 μm, 3.2 μm to 3.4 μm, 4.3 μm to 4.5 μm and 5.1 μm to 5.3 μm, etc., and preferably, is formed having a thickness of 1.2 μm, 2.4 μm, 3.3 μm, 4.4 μm and 5.2 μm, etc. The uniformity of the oxide film is maintained within a deviation of 0.3% for the entire thickness of the oxide film 12.

A method of preparing a film thickness standard comprises the step of repeatedly forming an oxide film under the same processing conditions thereby to form the film thickness standard on a semiconductor substrate having thickness greater than a predetermined level. Preferably, the thickness of the oxide film is over 1 μm, is continuous in thickness and is designated as a linear function on plane coordinates.

Preferably, the oxide film is formed by performing Plasma Enhanced Oxidation process, and setting up its thickness as 4,000 Å. The Plasma Enhanced Oxidation process is performed by supplying 95 liter/min. of $SiH_4$ and 1800 liter/min. of $N_2O$ gas, and preferably, at temperature of 400° C. and at pressure of 2.9 Torr.

A method of preparing a film thickness standard comprises the steps of: a) performing a test for characteristics of oxide films formed by various kinds of methods; b) deciding the process conditions for the formation of the oxide films as the thickness standard reference by the test results; c) setting the standard value of the thickness of the oxide film for the process conditions for the formation of the oxide films; d) forming the oxide films by the set standard value; and e) analyzing the characteristics of the oxide film so formed.

DETAILED DESCRIPTION

Figure 1:
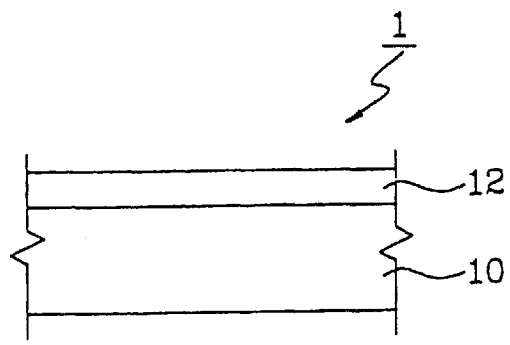
FIG. 1 is a cross sectional view showing an oxide film thickness standard (FTS) according to the present invention.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. It will be understood that when an element such as a layer, region or substrate is referred to as being "on" another element, it can be directly on the other element or intervening elements may also be present. In contrast, when an element is referred to as being "directly on" another element, there are no intervening elements present.

Figure 2:
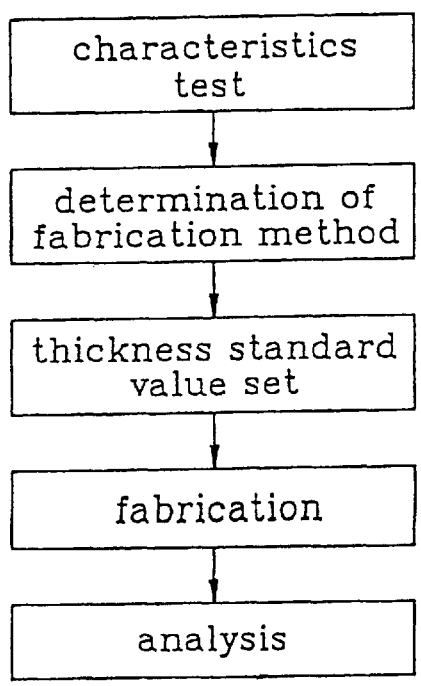
FIG. 2 is a flow chart showing a manufacturing method of the oxide film thickness standard according to the present invention.
Figure 3:
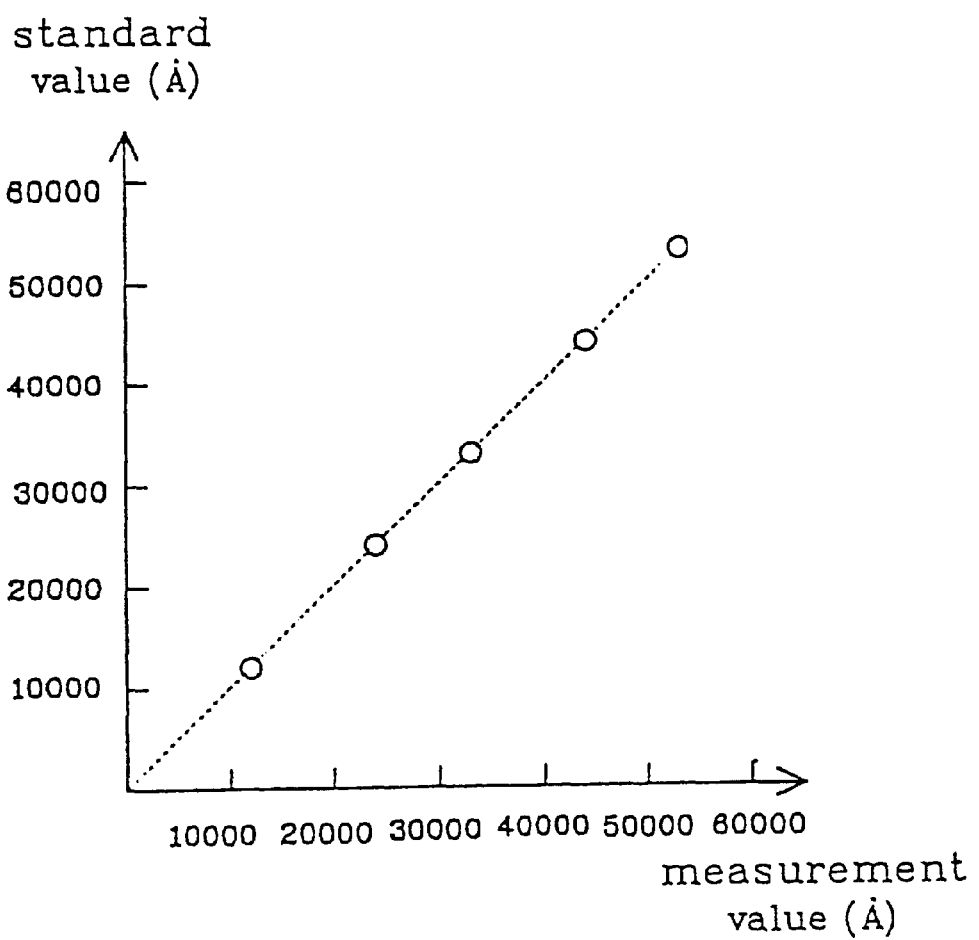
FIG. 3 is a graph showing standard values of the oxide film according to FIG. 2.

FIG. 1 is a cross sectional view showing a film thickness standard (FTS) according to the present invention. FIG. 2 is a flow chart showing a manufacturing method of an oxide film thickness standard according to the present invention. FIG. 3 is a graph showing standard values of an oxide film according to FIG. 2.

FIG. 1 shows a thickness standard reference 1 having an oxide film 12 formed on a semiconductor substrate 10, wherein an oxide film 12 having a thickness over 1 μm is formed on a semiconductor substrate 10 having a certain diameter. In one embodiment of the present invention, an oxide film 12 having a thickness over 1 μm is formed on a silicon substrate having a diameter of 200 mm.

According to the present invention, the oxide film 12 can be formed as plasma enhanced oxide film or tetra-ethyl-orthosilicate oxide film on the semiconductor substrate 10 by performing the process using plasma. The uniformity of the oxide film 12 is maintained within a deviation of 0.30 for the entire thickness of the oxide film 12.

An oxide film 12 of the present invention is formed such that the values of its thickness is continuous; that is, linear relation, and in one embodiment, the thickness of the oxide film 12 is set up and formed to have a continuity which is designated as linear function on a plane coordinates.

According to the present invention, the oxide film 12 has a thickness of 1.1 μm to 1.3 μm, 2.3 μm to 2.5 μm, 3.2 μm to 3.4 μm, 4.3 μm to 4.5 μm, and 5.1 μm to 5.3 μm, etc. and in one embodiment, it can be formed with a thickness of 1.2 μm, 2.4 μm, 3.3 μm, 4.4 μm and 5.2 μm, etc.

FIG. 2 is a process flow for manufacturing film thickness standard 1 of the oxide film 12. The above thickness standard reference 1 is decided by testing the characteristics for the oxide films manufactured by various kinds of methods, that is, oxide film 12 for the thickness standard reference 1.

According to a preferred embodiment of the present invention, a plasma oxide film is formed for the above oxide film 12 using Plasma Enhanced Oxidation. The Plasma Enhanced Oxidation is performed at temperature of 400° C. and at a pressure of 2.9 Torr supplying 95 liter of $SiH_4$ and 1,800 liter of $N_2O$. A plasma oxide film having a thickness of 4,000 Å is formed according to the present process using plasma.

In addition, an oxide film 12 having a thickness over 1 μm is formed by carrying out the process using plasma continuously.

The uniformity of the oxide film 12 formed by the above processing steps is maintained within a deviation of 0.3% for its entire thickness, and in a preferred embodiment, the uniformity is within 0.2% of deviation.

Further, in order to set up the standard value of the thickness of the oxide film 12 used as a thickness standard reference 1, a conventional thickness standard reference having a thickness below 0.7 μm is used and then the standard value of the thickness standard reference having a thickness over 1 μm is set up respective thereto.

The standard value of the thickness of the present invention is set up to have a certain type of continuity as shown in FIG. 3, and in one embodiment, it is shown as linear function on a plane coordinates.

According to the present invention, the thickness of the oxide film 12 is set up to be suitable for the standard value of the thickness set up as above. That is, the oxide film 12 is formed with a thickness such as: 1.2 μm, 2.4 μm, 3.3 μm, 4.4 μm, and 5.2 μm, etc.

The oxide film 12 is formed by carrying out the above process continuously, that is, the 1.2 μm of oxide film 12 is formed by carrying out the process three times, 2.4 μm is formed by six times, 3.3 μm is formed by eight times, respectively. The oxide film 12 having a thickness of 4.4 μm is formed by carrying out the process eleven times, and 5.2 μm is thirteen times.

Then, the analysis process is performed for analyzing the oxide film 12 formed by the above continuously-performed process.

In the analysis process, thickness of the oxide film 12 is checked to see whether it has the set-up thickness, and its uniformity and refraction angle are analyzed so as to analyze the data of the above analysis process to see that it meets the theoretical value.

The analysis result is used to form an oxide film 12 on a semiconductor substrate 10 as a thickness standard reference 1 when the data for the analysis meets the standard data suitable for the thickness standard reference 1.

Accordingly, the present invention to provide the method of manufacturing an oxide film thickness standard reference having a thickness over 1 μm allows to make an efficient use of the oxide film 12 having a thickness over 1 μm.

In order to manufacture film thickness standards according to the invention, the characteristics of the oxide films manufactured by various kinds of methods are tested and the method of manufacturing the oxide film 12 for the thickness standard reference is determined by using the test result as standard.

TABLE 1

|  | average value (Å) | standard deviation (Å) | maximum-minimum (Å) | uniformity (%) |
|---|---|---|---|---|
| oxide film 1 | 3,897.95 | 1.3 | 4.42 | 0.11 |
| oxide film 2 | 3,771.12 | 0.97 | 3.64 | 0.1 | uniformity=(maximum−minimum)×100/average value    formula 1

TABLE 2

|  | thickness (Å) | refraction (Nf) | G.O.F |
|---|---|---|---|
| oxide film 1 | 3,877.85 | 1.4661 | 0.9804 |
| oxide film 2 | 3,741.54 | 1.4701 | 0.9825 |

The oxide film 1 and 2 are plasma oxide films formed by using plasma, and using the above formula 1 and the values designated in the table 1, the uniformity is 0.11% and 0.1%.

The refraction angle in the above table is detected by measuring at 21 points in the ranges within 5 mm of the semiconductor substrate 10 having the oxide film 1 and 2 thereon and using an optical probe. As shown in the table 2, the difference between the theoretical value and the practical value of the above refraction angle is illustrated as G.O.F. (Goodness of Fitness):0.9804 and 0.9825.

According to the present invention, the process using plasma is determined as processing conditions for the method of manufacturing the oxide film 12 for the thickness standard reference 1.

The conditions of the process using the above plasma are as follows:temperature 400° C. ; pressure 2.9 Torr and supply of 95 liter per min. of $SiH_4$ and 1,800 liter per min. of $N_2$.

Accordingly, 4,000 Å of oxide film 12, that is, plasma oxide film is formed in carrying out the above process first time.

The standard value of the thickness of the oxide film 12 is determined such that the thickness values of the oxide film 12 are designated as linear function on a plane coordinates.

Accordingly, the standard value of the oxide film 12 of the oxide film thickness standard reference is set up by using the standard value of the conventional oxide film thickness standard reference below 0.7 μm and setting up the standard value of the thickness of the oxide film 12 of the oxide film thickness standard reference over 1 μm.

That is, according to the present invention, after forming the oxide film 12 with a thickness over 1 μm, and detecting the value of the thickness of the oxide film 12 using optical probe, the value is substituted for the standard value of the thickness of the conventional thickness standard reference below 0.7 μm. The results are shown in table 3.

TABLE 3

|  | measure 1 | measure 2 | measure 3 | measure 4 | measure 5 |
|---|---|---|---|---|---|
| 12000 Å | 12290.6 | 12257 | 12262.2 | 112266.9 | 12269.2 |
|  | 12306.9 | 12274.1 | 12277.7 | 12276.1 | 12283.7 |
|  | 12399.6 | 12364.9 | 12365 | 12366.9 | 12374.1 |
|  | 12305.9 | 12271.3 | 12276.7 | 12279.4 | 12283.3 |
|  | 12376.1 | 12343.6 | 12349.1 | 12345.5 | 12353.6 |

TABLE 3-continued

|  | measure 1 | measure 2 | measure 3 | measure 4 | measure 5 |
|---|---|---|---|---|---|
| 24000 Å | 24677.5 | 24623.7 | 24622.7 | 24638.1 | 24640.5 |
|  | 24569.7 | 24490.2 | 24492.3 | 24504.1 | 24514.1 |
|  | 24605 | 24540.1 | 24541.9 | 24545.8 | 24558.2 |
|  | 24742 | 24667.5 | 24668.1 | 24682.1 | 24689.9 |
|  | 24633.7 | 24556.5 | 24577.6 | 24563.2 | 24582.8 |
| 33000 Å | 32955.5 | 32866.7 | 32870 | 32881.9 | 32893.5 |
|  | 33113 | 33018.9 | 33018.8 | 33026.3 | 33044.2 |
|  | 32933.1 | 32822.7 | 32837.4 | 32839.5 | 32858.2 |
|  | 32933.1 | 32822.7 | 32837.4 | 32839.5 | 32858.2 |
|  | 33135.1 | 33035.7 | 33031.6 | 33057.5 | 33065 |
| 44000 Å | 44872.4 | 44745.3 | 44757.3 | 44773 | 44787 |
|  | 45011.7 | 44905.8 | 44882.1 | 44910.1 | 44927.4 |
|  | 44859.4 | 44735.8 | 44754.2 | 44767.5 | 44779.2 |
|  | 40895 | 40762.7 | 40783.4 | 40779.7 | 40805.2 |
|  | 41084.8 | 40990.5 | 40983.2 | 41002.7 | 41015.3 |
| 53000 Å | 53046.8 | 52892.2 | 52906.1 | 52919 | 52941 |
|  | 53389.6 | 53252.7 | 53259.7 | 53268.7 | 53292.7 |
|  | 52965.8 | 52807.7 | 52832.5 | 52840.5 | 52861.6 |
|  | 52915.8 | 52750.9 | 52773.9 | 52775.8 | 52804.1 |
|  | 53365.3 | 53226.3 | 53237.9 | 53239.1 | 53267.1 |

Therefore, according to the present invention, the standard value of the thickness of the oxide film 12 of the thickness standard reference 1 having a thickness over 1um is determined based on the above average value.

Based on the average value of the table 3, the standard value of the thickness of the oxide film 12 has a linearity as shown in FIG. 3, and also, it can be shown as a linear function as shown in formula 2.

$$Y = 0.9991x - 2.1514 \quad \text{formula 2}$$

That is, the inclination of the linear function of the above formula 2 which is illustrated by the standard values of y-axis and the measurement values of x-axis is close to 1 as shown in FIG. 3.

Accordingly, the thickness of the oxide film 12 is set up as 1.24 μm, 2.4 μm, 3.3 μm, 4.4 μm and 5.3 μm, etc. based on the average value, the results of the above table 3 according to the present invention.

That is, the measurement value shown in the table 3 is substituted for the standard value of the conventional thickness standard reference and the standard value of the thickness of the oxide film 12 of the present invention is determined by the average of the above substitution result.

After forming the thickness of the oxide film 12 with the thickness data having linearity, and continuously carrying out the process using plasma, the oxide film 12 of the thickness standard reference 1 is formed.

The oxide film 12 is formed on the semiconductor substrate 10, that is, silicon substrate, its diameter being 200 mm.

According to the present invention, the process using the plasma is continuously carried out three times, and the oxide film 12 having a thickness of 1.2 μm. In carrying out six times, 2.4 μm of oxide film is formed, and eight times, 3.3 μm of oxide film is formed, respectively.

Further, 4.4 μm of the oxide film 12 is formed by carrying out the process eleven times, and 5.3 μm of the oxide film is formed by thirteen times.

After forming the oxide film 12 having a set-up thickness, the analysis process is performed for the oxide film 12 according to the present invention.

In other words, the analysis is performed to check whether the formed oxide film 12 is formed with the set-up thickness, and the uniformity of the oxide film 12 is suitable for the application of the thickness standard reference 1.

|  | average value (Å) | maximum − minimum (Å) | uniformity (%) |
|---|---|---|---|
| 1 | 12289.3 | 21 | 0.17 |
| 2 | 12301.2 | 14.01 | 0.11 |
| 3 | 12392.3 | 11.92 | 0.1 |
| 4 | 12304.3 | 20 | 0.16 |
| 5 | 12369 | 13.28 | 0.11 |
| 6 | 24658.7 | 20.9 | 0.08 |
| 7 | 24528.9 | 40.97 | 0.17 |
| 8 | 24580 | 20.72 | 0.08 |
| 9 | 24704.2 | 25.66 | 0.1 |
| 10 | 24594.2 | 35.01 | 0.14 |
| 11 | 32919.6 | 44.22 | 0.13 |
| 12 | 33059.7 | 27.49 | 0.08 |
| 13 | 33046.9 | 46.57 | 0.14 |
| 14 | 32862 | 32.95 | 0.1 |
| 15 | 33079.5 | 42.87 | 0.13 |
| 16 | 44792.7 | 42.57 | 0.1 |
| 17 | 44935 | 45.89 | 0.1 |
| 18 | 44785.1 | 42.68 | 0.1 |
| 19 | 40814.1 | 42.75 | 0.1 |
| 20 | 41043 | 41.62 | 0.1 |
| 21 | 52969 | 53.34 | 0.1 |
| 22 | 53327.1 | 68.73 | 0.13 |
| 23 | 52887.5 | 52.5 | 0.1 |
| 24 | 52834.2 | 90.18 | 0.17 |
| 25 | 53292 | 57.54 | 0.11 |

$$\text{uniformity} = (\text{maximum} - \text{minimum}) \times 100 / \text{average value} \quad \text{formula 3}$$

According to the present invention, the uniformity of the above oxide film 12 is analyzed by using the data result of the above table 3 and formula 3, and as a result of the analysis, if the deviation of the thickness of the oxide film 12 is maintained within 0.2%, the reliability for the fabrication of thickness standard reference 1 of the oxide film 12 is provided.

Therefore, according to the present invention, by manufacturing the thickness standard reference 1 of the oxide film 12 having a thickness over 1 μm and using the thickness standard reference 1, the easy management of the oxide film 12 having a thickness over 1 μm is possible.

That is, the thickness standard reference 1 of the present invention is efficiently used for manufacturing the recent semiconductor devices having a thickness over 1 μm.

Accordingly, the above method of the thickness using the thickness standard reference 1 of the present invention allows an efficient management for the thickness of the oxide film during the formation of the oxide film in the semiconductor device manufacturing process using CVD.

It will be apparent to those skilled in the art that various modifications and variations of the present invention can be made without departing from the spirit or scope of the invention. Thus, it is intended that the present invention cover the modifications and variations of this invention provided they come within the scope of the appended claims and their equivalents.

What is claimed is:

1. A method of preparing a film thickness standard on an integrated circuit substrate, comprising:
   successively forming oxide film layers upon one another on the integrated circuit substrate until a continuous film thickness standard is formed having a thickness greater than 1 micron, wherein each of the oxide film layers has a same thickness.

2. The method according to claim 1, wherein the continuous film thickness standard is substantially free of uniformity variations such that deviation of the thickness of the continuous film thickness standard from a desired value is less than or equal to 0.3% over the entire continuous film standard.

3. The method according to claim 2, wherein the continuous film thickness standard is substantially free of uniformity variations such that deviation of the thickness of the continuous film thickness standard from a desired value is less than or equal to 0.2% over the entire continuous film standard.

4. The method according to claim 1, wherein the continuous film thickness standard is substantially free of uniformity variations such that deviation of a refraction angle from a theoretical value for the continuous film standard is less than or equal to 0.2%.

5. The method according to claim 1, wherein the step of successively forming each of the oxide film layers comprises successively forming each of the oxide film layers by a Plasma Enhanced Oxidation process.

6. The method according to claim 5, wherein the step of successively forming each of the oxide film layers comprises successively forming each of the oxide film layers under constant Plasma Enhanced Oxidation process conditions by supplying 95 liter/min. of $SiH_4$ and 1800 liter/min. of $N_2O$ gas.

7. The method according to claim 6, wherein the constant Plasma Enhanced Oxidation process conditions take place at 400° C.

8. The method according to claim 7, wherein the same thickness of each of the oxide film layers is 4000 Å.

9. The method according to claim 6, wherein the constant Plasma Enhanced Oxidation process conditions take place at 2.9 Torr.

* * * * *